(12) United States Patent
Burger et al.

(10) Patent No.: US 10,930,811 B2
(45) Date of Patent: Feb. 23, 2021

(54) OPTOELECTRONIC APPARATUS HAVING A CODING ELEMENT

(71) Applicant: Vishay Semiconductor GmbH, Heilbronn (DE)

(72) Inventors: Daniel Burger, Leingarten (DE); Sascha Kuhn, Oedheim (DE); Peter Mühleck, Offenau (DE)

(73) Assignee: VISHAY SEMICONDUCTOR GMBH, Heilbronn (DE)

( * ) Notice: Subject to any disclaimer, the term of this patent is extended or adjusted under 35 U.S.C. 154(b) by 100 days.

(21) Appl. No.: 16/078,877

(22) PCT Filed: Feb. 22, 2017

(86) PCT No.: PCT/EP2017/054051
§ 371 (c)(1),
(2) Date: Aug. 22, 2018

(87) PCT Pub. No.: WO2017/144527
PCT Pub. Date: Aug. 31, 2017

(65) Prior Publication Data
US 2019/0058075 A1 Feb. 21, 2019

(30) Foreign Application Priority Data
Feb. 23, 2016 (DE) ...................... 10 2016 103 113.5

(51) Int. Cl.
*H01L 31/167* (2006.01)
*H01L 31/0203* (2014.01)
(Continued)

(52) U.S. Cl.
CPC ........ *H01L 31/167* (2013.01); *H01L 31/0203* (2013.01); *H01L 31/02005* (2013.01); *H01L 31/02325* (2013.01)

(58) Field of Classification Search
CPC ............. H01L 31/167; H01L 31/02005; H01L 31/0203; H01L 31/02325
(Continued)

(56) References Cited

U.S. PATENT DOCUMENTS 4,682,040 A 7/1987 Hohki et al.
4,764,669 A 8/1988 Decker et al.
(Continued)

FOREIGN PATENT DOCUMENTS

DE 102006005519 A1 8/2007
DE 102007025458 A1 12/2008
(Continued)

OTHER PUBLICATIONS

Asshoff, J. "Optische Datenspeicher Der CD-Player." CDs und CD-Player: Aufbau und Funktionsweise. Apr. 1997. (*machine translation).

(Continued)

*Primary Examiner* — Seung C Sohn
(74) *Attorney, Agent, or Firm* — Volpe Koenig

(57) ABSTRACT

An optoelectronic apparatus is provided having a carrier device that has at least one optoelectronic transmitter and/or at least one optoelectronic receiver at an upper side; having a lens element that is provided above the carrier device and that has at least one lens section for the at least one optoelectronic transmitter and/or for the at least one optoelectronic receiver; and having a holding device that at least partly surrounds the carrier device and the lens element. The lens element has a mechanical coding section that projects out of the holding device and that enables at least one coding element for identifying the optoelectronic apparatus.

24 Claims, 6 Drawing Sheets

(51) Int. Cl.
*H01L 31/0232* (2014.01)
*H01L 31/02* (2006.01)

(58) Field of Classification Search
USPC .......................................................... 250/239
See application file for complete search history.

(56) References Cited

U.S. PATENT DOCUMENTS

| | | | |
|---|---|---|---|
| 4,920,357 A | | 4/1990 | Johnson |
| 5,170,047 A | | 12/1992 | Beauchamp et al. |
| 5,396,062 A | * | 3/1995 | Eisentraut .......... H01R 13/6641 250/229 |
| 6,036,298 A | * | 3/2000 | Walker .................. B41J 29/393 347/19 |
| 9,389,406 B2 | * | 7/2016 | Kubek ..................... G02B 7/16 |
| 2009/0020689 A1 | | 1/2009 | Frenzel et al. |
| 2012/0292660 A1 | | 11/2012 | Kanno |
| 2015/0062919 A1 | | 3/2015 | Teodecki et al. |
| 2015/0226839 A1 | | 8/2015 | Brandl et al. |

FOREIGN PATENT DOCUMENTS

| | | | |
|---|---|---|---|
| DE | 202014104049 U1 | 10/2014 | |
| EP | 2568444 A1 | 3/2013 | |
| GB | 2452073 A | 2/2009 | |
| WO | WO-2008151909 A1 * | 12/2008 | ........... H05K 7/1455 |
| WO | 2012101547 A1 | 8/2012 | |

OTHER PUBLICATIONS

Office Action issued in corresponding Taiwanese Patent Application No. 106105899 dated Aug. 27, 2020, consisting of 13 pp. (English Translation Provided).

* cited by examiner

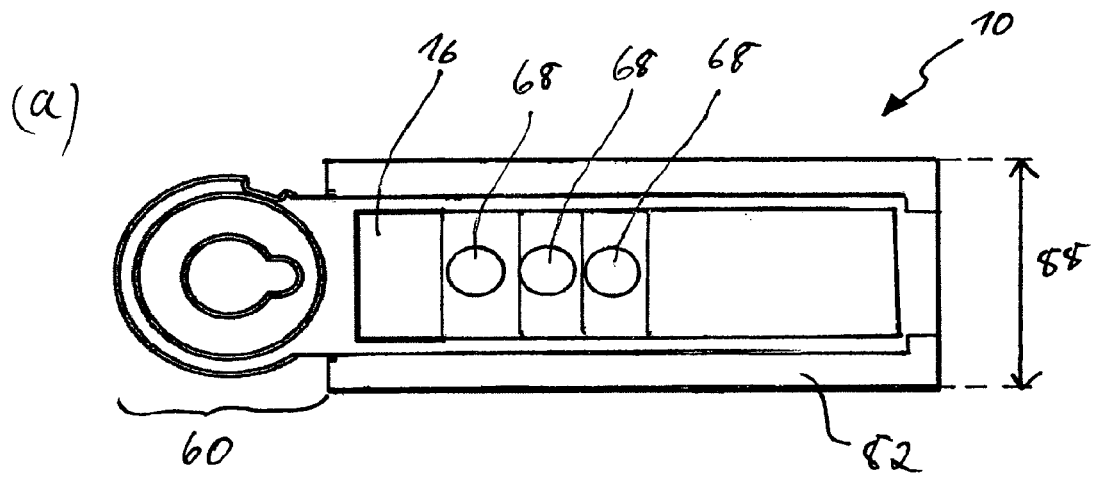
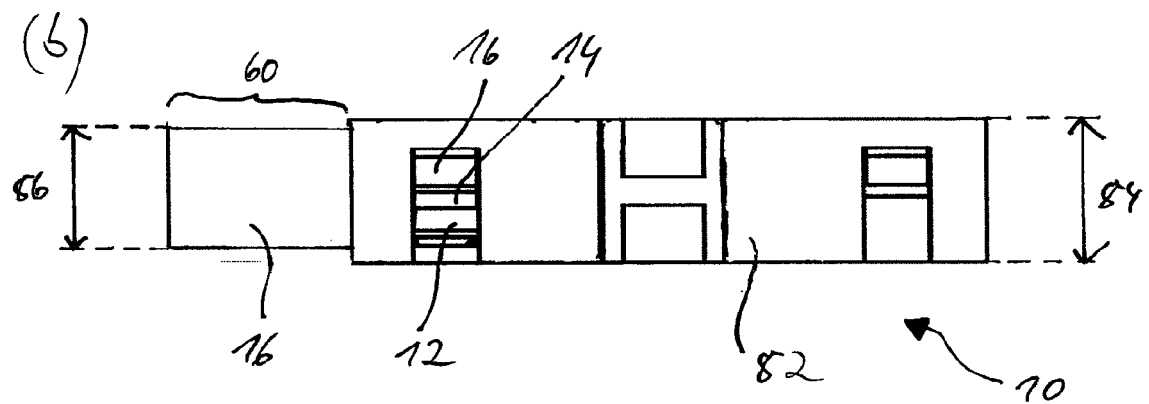
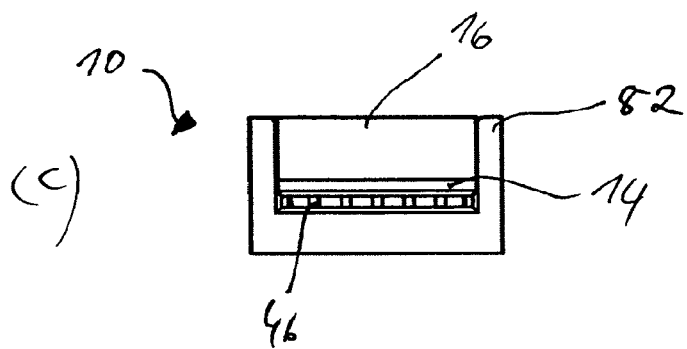
Fig. 7

OPTOELECTRONIC APPARATUS HAVING A CODING ELEMENT

CROSS REFERENCE TO RELATED APPLICATION(S)

This application is a § 371 application of International Application No. PCT/EP2017/054051, filed Feb. 22, 2017, which is incorporated by reference as if fully set forth.

FIELD OF INVENTION

The present invention relates to an optoelectronic apparatus having a carrier device that has at least one optoelectronic transmitter and/or at least one optoelectronic receiver at an upper side. The carrier device can simultaneously serve for the electrical contacting of the optoelectronic transmitter and/or of the optoelectronic receiver. A lens element that has at least one lens section for the at least one optoelectronic transmitter and/or for the at least one optoelectronic receiver is provided above the carrier device, i.e. above the transmitter and/or the receiver with respect to a vertical direction. For this purpose, the respective lens section can have beam-shaping and/or beam-deflecting properties. The apparatus furthermore has a holding device that holds the carrier device and the lens element relative to one another and partly surrounds them.

BACKGROUND

Such optoelectronic apparatus are in particular configured as optoelectronic sensor apparatus to be able to optically scan and electronically detect properties of objects. An application for such sensor apparatus is in the sector of commercially available printer devices, i.e. apparatus for a computer-assisted printing of paper by means of known printing technologies, e.g. laser printing technology or inkjet printing technology. To allow an operation of a printer (or of a multifunctional device comprising a printer) that is as fully automatic and as user-friendly as possible, different operating parameters of the printer such as a quantity or a type of the paper placed into the reception tray of the printer, a provide paper format, the relative position of a paper edge and the like are determined and are monitored as necessary. There is furthermore a need for an automatic analysis of a respective printing result or of a paper to be scanned in order e.g. to check the content type (image vs. text) of the paper to be scanned or the correct configuration (e.g. mechanical alignment of a printing unit of the printer) with reference to a printing result.

An individually adapted optoelectronic apparatus is typically provided for each operating parameter to be measured and is configured to compare an emitted optical signal with a detected, e.g. reflected, optical signal to be able to determine the respective operating parameter from the difference of these optical signals. The optical signals are generally electromagnetic radiation of a visible or non-visible wavelength, in particular infrared. The apparatus frequently comprises both an optoelectronic transmitter and (at least) one optoelectronic receiver. The apparatus can thus, for example, act as a proximity sensor. Variants are, however, also possible in which an optoelectronic apparatus only has an optoelectronic transmitter or only an optoelectronic receiver (for a passive detection). Apparatus having a plurality of transmitters and receivers are furthermore possible, with an apparatus e.g. being able to determine, in particular simultaneously, a plurality of operating parameters (e.g. by a distinction between diffuse and reflective reflection).

Due to the large number of operating parameters to be measured, a corresponding variety of optoelectronic apparatus is required, which is associated with an unwanted cost effort in manufacture and storage. In addition, an optoelectronic apparatus for measuring a respective operating parameter has to satisfy specific optical properties that may differ greatly in dependence on the respective operating parameter and may require a high development effort in this respect. The optical properties are in particular to be understood as the guiding and shaping of beams or of optical signals that are transmitted by the optoelectronic transmitter and/or are received by the optoelectronic receiver for the measurement of the respective operating parameter.

There is furthermore a practical problem in being able to distinguish the different types or kinds of apparatus from one another, in particular in the course of their assembly. This problem is in particular present when a plurality of different optoelectronic apparatus have to be installed together in one (printer) device, with the apparatus being externally similar and therefore being able to be easily confused. An incorrectly installed apparatus would, however, produce a malfunction of the respective device that could be serious under certain circumstances.

To reduce the risk of confusion between different optoelectronic apparatus, the respective apparatus can e.g. be provided with a respective sticker or with a color code. Such markings can, however, easily be incorrectly interpreted and cannot easily be automatically detected. Corresponding additional measures are furthermore complex and can result in higher manufacturing costs for the different apparatus.

SUMMARY

It is an object of the invention to provide an apparatus of the initially named kind that allows an unambiguous identification of the apparatus in order in particular to minimize the risk of confusion between two different types of apparatus and to minimize the risk of an incorrect installation.

The object is satisfied by an optoelectronic apparatus having the features of claim 1 and in particular in that the lens element has a mechanical coding section that projects out of the holding device and that has at least one coding element for identification of the optoelectronic apparatus.

The identification of the optoelectronic apparatus preferably relates to an underlying apparatus type, i.e. a respective coding element identifies a group (e.g. a class or a kind) of apparatus. Alternatively, a coding element can, however, also serve for the identification of a specific, i.e. individual, optoelectronic apparatus. In this respect, a coding element can, for example, be associated with a specific feature or a specific feature combination of the apparatus.

The coding section of the lens element can in particular project out of the holding device such that the coding section is accessible from the outside for a mechanical or optical sensing when the optoelectronic apparatus has been completely assembled. The coding section of the lens element can in particular laterally project out of the holding device such that the coding section projects—viewed in the vertical direction—above a bottom section of the holding device.

The coding element provided at the coding section is preferably easily visible and/or manually tangible from the outside. The apparatus is thus able to be directly identified in a visual or optical and/or tactile manner, which particularly effectively reduces the risk of confusion between different apparatus types, in particular during an installation.

Since the coding section projects out of the holding device, the direct identification ability is additionally promoted. The respective coding element can in particular be adapted to be detected automatically to enable an automated identification of the optoelectronic apparatus. The coding section can be integral, i.e. in one part, with the lens element. It is alternatively also conceivable to connect the coding section, fixedly or releasably, to the lens element by means of a latching connection, for example, whereby said lens element or the coding section can be replaced as required.

The coding element can also be used, alternatively or additionally to an active, in particular optical and/or tactile identification by a technician or by an automatic detection device, for a passive identification to preclude as largely as possible from a mechanical aspect an incorrect assembly of the optoelectronic apparatus on the basis of the so-called "poka-yoke principle". In accordance with the poka-yoke principle, a suitable shape matching with the assembly environment or with the ground is necessary so that an installation of the optoelectronic apparatus is possible at all mechanically. A decoding element that is provided in the installation environment and that is configured as complementary to the coding element can thus be used for the purpose that only the apparatus having the matching coding element can be installed, and indeed at a predefined position and with a predefined alignment. The installation of an incorrect or unwanted apparatus or the installation of a desired apparatus in an unwanted manner can thus be practically completely avoided.

The fact that the coding section (with the coding element) is formed at the lens element and not, for instance, at another component of the apparatus, provides advantages, in particular with respect to an installation of the apparatus based on the described poka-yoke principle. The lens element namely as a rule represents that component of the apparatus whose positioning has to take place particularly exactly to ensure a problem-free function of the apparatus within the framework of the provided application (e.g. measuring a distance). The lens element has as a rule have to be positioned particularly exactly to implement the desired optical properties of the apparatus (e.g. focusing an incident optical signal onto an optoelectronic receiver). To ensure an exact positioning of the optoelectronic apparatus, a decoding element can be used that is provided in the installation environment of the apparatus and that e.g. ensures the exact alignment of the lens element relative to a desired detection zone when the apparatus is correctly installed. A decoding element can, for example, support the lens element via the coding section. A further reason why the attachment of the coding section to the lens element is particularly advantageous comprises the lens element typically being a component of the optoelectronic apparatus with particularly small production tolerances.

The optoelectronic apparatus is characterized by a modular design in which the apparatus is assembled in the manner of a module system from different, separate components. These separate components comprise at least the carrier device, the lens element and the holding device. Optionally, further effective components can be provided, e.g. an aperture element and/or a filter element. The individual components are preferably releasably connected to one another or held at one another. The components can in particular be held at one another in a force-transmitting and/or shape-matched manner. The components can be arranged substantially behind one another along the named vertical direction (e.g. in a layer arrangement or in a sandwich structure). Different variants of the carrier device and of the lens element as well as optional components can hereby be combined with one another in a simple manner on the basis of a universal modular platform to produce different optoelectronic apparatus, with some components of the different optoelectronic apparatus being able to be the same (e.g. the holding device).

A lens element is to be understood in connection with the invention as an imaging element that can in particular have refractive properties. The respective lens section can have beam-shaping properties, in particular in that the respective lens section has an arch at one side or at two sides (e.g. as a converging lens, a diverging lens or as a Fresnel lens). Alternatively or additionally hereto, the respective lens section can effect a deflection of a beam, i.e. a change in the direction of propagation of an emitted or received beam. The respective lens section can in particular have a wedge shape (e.g. design as a wedge lens having two planar surfaces aligned at an acute angle with one another). The respective lens section can be aligned in parallel with or obliquely to a plane of extent of the carrier device. The lens element can be of plate shape outside the respective lens section. The respective lens section can be formed integrally and/or above the optoelectronic transmitter or receiver.

The carrier device of the optoelectronic apparatus can be at least substantially of plate shape and/or can comprise an overmolded lead frame. The carrier device can comprise a plurality of electrical connectors that can be connected to an ASIC (application—specific integrated circuit) of the carrier device and/or to the optoelectronic transmitter or receiver. The connectors of the carrier device can enable an electrical contacting from the outside. The connectors can in particular be provided for connection of the carrier device to a microcontroller associated with the optoelectronic apparatus in order to be able to operate the apparatus in accordance with the application. The initially named vertical direction can in particular extend perpendicular to a plane of extent of the carrier device.

The lens element can in particular be at least substantially of plate shape and/or can comprise at least one integrally formed lens section that is arranged above the optoelectronic transmitter or receiver.

The holding device serves to hold at least the carrier device and the lens element relative to one another, with an alignment of the lens element with respect to the carrier device being maintained, with the latter being equipped with the at least one optoelectronic transmitter and/or receiver. In this respect, the holding device can secure and/or fix the lens element directly or indirectly at the carrier device. The holding device can for this purpose, for example, have a clip or at least a clip-like element that at least engages around or engages behind the carrier device and the lens element. Additionally or alternatively, the holding device can be formed in the manner of a housing or of a cage, with such a holding device not having to completely surround the carrier device and the lens element, in particular not over the whole surface and also not at every side of the apparatus. The holding device can thus serve at least functionally as a housing of the apparatus or can even be a real, at least predominantly closed housing, with at least a mechanical encapsulation of the components of the apparatus being ensured.

The holding device can in particular have a base plate having a plurality of side walls and/or having a plurality of, in particular two, four or six, holding arms or holding sections disposed opposite one another pairwise. The base plate can have a uniform plate size that is e.g. adapted to the shape and size of the carrier device and/or of the lens element. The apparatus can hereby be robust and compact, with an adhesion or penetration of dirt and the like on or into the apparatus respectively being avoided. The base plate is preferably arranged at a lower side of the carrier device and forms a bottom section. The holding device can have an at least sectionally step-shaped and/or U-shaped cross-section and/or a plurality of openings such that a component of the apparatus that is placed into the holding device and that is formed at least sectionally complementary to the holding device, is captured laterally and/or in the vertical direction in the holding device without separate fastening means being required for this purpose. The holding device can furthermore be formed in one part or in multiple parts, in particular in two parts.

The modular design of the apparatus is advantageous, on the one hand, to be able to manufacture in an inexpensive manner a plurality of different apparatus types using substantially uniform components that only slightly differ from one another. On the other hand, it is however, conceivable that an appearance of the apparatus is produced that is uniform overall by a use of uniform components, which could in principle increase the risk of confusion between different apparatus types. An increase in the risk of confusion is, however, avoided with the apparatus in accordance with the invention by the individual coding section of the lens element. This can always be formed in a specific region of the apparatus independently of a respective apparatus type in order to effect a uniform manner of marking of the apparatus and thus a reduced risk of confusion in this respect.

In accordance with an advantageous embodiment, the mechanical coding section can project out of the holding device in a lateral direction, i.e. transversely to the named vertical direction.

The optoelectronic apparatus preferably has a shape that is at least substantially rectangular in cross-section, with the mechanical coding section projecting out of the holding device at a narrow side of the rectangular shape. The coding section preferably extends in parallel with a longitudinal axis of the apparatus and in this respect forms a prolongation of the apparatus that extends in the longitudinal direction and that can be set apart from the apparatus in a characteristic manner. The arrangement of the coding section at the narrow side has the advantage that the rectangular and preferably slim shape of the apparatus is maintained despite the coding section and the apparatus fits manually easily in the hand during the installation if a manual installation is provided. The coding section is in this respect more easily visible in cases of doubt in comparison with a middle or central positioning of the coding section and is in particular optically detectable (e.g. during an automatic installation process). A rectangular shape of the apparatus furthermore has advantages with respect to other shapes in many applications, for example with respect to the provision of a suitable installation environment for the apparatus.

It is preferred with respect to the described shape matching with the installation environment in accordance with the mechanical poka-yoke principle if a piece of identification information of the respective coding element of the coding section can be detected along the named vertical direction of the optoelectronic apparatus. The apparatus can thus be assembled with the lower side at the front at the installation environment and the piece of identification information of the respective coding element can be directly mechanically scanned. The lower side of the optoelectronic apparatus is to be considered in connection with the invention as that side that is remote from the optoelectronic transmitter and/or receiver from the point of view of the carrier device. That side is accordingly to be considered the upper side of the optoelectronic apparatus in whose direction the optoelectronic transmitter and/or receiver installed at the carrier device is/are aligned.

In accordance with a preferred embodiment, the at least one coding element has at least one elevated portion and/or at least one recess of the mechanical coding section. The elevated portion and/or the recess can in particular be formed with respect to a rotationally symmetrical structure or with respect to a planar surface. Such a coding element can be manufactured in a simple manner, for example by means of a mold for the lens element that is formed sectionally in a complementary manner to the desired shape of the coding element. Both an elevated portion and a recess are furthermore particularly suitable for implementing the described poka-yoke principle. A coding element can have a predefined shape and/or a predefined size and/or a predefined position for the individual identification of the optoelectronic apparatus.

In accordance with a further preferred embodiment, the mechanical coding section has a ring-shaped structure. This in particular characteristically sets itself apart from the otherwise in particular rectangular apparatus and directs the attention at least indirectly to the at least one coding element that can in particular be provided at an outer periphery and/or at an inner periphery and/or at an end face of the ring-shaped structure. The ring-shaped structure has the advantage in this respect that the coding element can e.g. only be formed at a periphery of the ring-shaped structure in dependence on an angle about an axis or about a center of the ring-shaped structure. Practically any desired number of positions that are uniformly parameterized can thus be provided for a respective coding element along a periphery, wherein the region for a respective coding element is nevertheless fixed in a uniformly and spatially bounded manner to allow a fast and reliable identification of the apparatus. In this manner, a respective coding element can also advantageously be formed by means of a single tool that is preferably easily configurable (in particular an injection molding tool) at the coding section, with e.g. only the angular position of a rotary bush needing to be set. A ring-shaped structure can in another respect also be used to fasten the apparatus to the provided installation environment by means of a screw that is guided through a central opening of the ring-shaped structure such that the apparatus is also reliably installed with a mechanical load, in particular due to vibrations.

In accordance with a further preferred embodiment, the mechanical coding section has a first coding element and a second coding element, with the first coding element being provided at an outer periphery and with the second coding element being provided at an inner periphery of the ring-shaped structure. The first coding element can in this manner identify the apparatus type ("product ID") and the second coding element can identify an address or an address format ("I2C ADR ID") of a bus type (e.g. I2C bus) provided to control the apparatus. The two coding elements can be configured differently to increase their individual identification force. The shape of a first coding element can, for example, differ characteristically from the shape of a second coding element. To distinguish which of a plurality of first coding elements should respectively identity an associated apparatus, the first coding elements can differ with respect to their size and/or position. The same can be provided for the distinguishing capability of a plurality of second coding elements. A respective complementary decoding element can also be provided for both coding elements (first and second) when applying the poka-yoke principle at a provided installation environment, whereby the risk of the installation of an unwanted apparatus or the risk of an incorrect installation can be precluded in a dual manner.

The ring-shaped structure can in particular comprise a hollow cylinder. In this respect, an annular disk can extend within the hollow cylinder in a plane perpendicular to the longitudinal axis of the hollow cylinder. The longitudinal axis of the hollow cylinder preferably extends perpendicular to a plane of the lens element, i.e. the annular disk extends within or in parallel with the plane of the lens element. The annular disk can be arranged centrally with respect to the end faces of the hollow cylinder such that a hollow cylinder results that is specularly symmetrical in the longitudinal direction. The apparatus can thus be installed at least independently of the respective end face of the hollow cylinder, whereby the apparatus can be used in a more versatile manner and can be installed in different alignments. The hollow cylinder structure is also characterized in that a respective recess is formed at the end faces of the hollow cylinder, which recess can likewise be understood and used as a coding element of the apparatus.

In accordance with a further embodiment, the at least one lens section of the lens element extends within a plane of extent of the lens, with the mechanical coding section projecting out of the plane of extent of the lens. The mechanical coding section can in particular extend along the named vertical direction of the optoelectronic apparatus. The lens element can hereby be particularly advantageously supported and exactly aligned via the coding section in the installed state of the apparatus. In a preferred variant, the coding section, however, does not extend up to an upper side and/or lower side of the holding device and/or of the apparatus such that a planar contact surface of the holding device or of the apparatus does not simultaneously form a contact surface for the coding section. Coincidences or mechanical tensions between the lens element and the other components of the apparatus can hereby be effectively avoided.

The holding device and the lens element can be directly or indirectly secured to one another by means of a latching connection. The two parts can hereby be reliably, but nevertheless releasably, to one another. It is additionally in particular also possible that the lens element is captured between the holding device and the carrier device with a house-like or cage-like formation of the holding device.

In accordance with a further embodiment, the optoelectronic apparatus furthermore has at least one aperture element that has at least one aperture section for the at least one optoelectronic transmitter and/or for the at least one optoelectronic receiver. A cross-sectional extent and/or an angular range of the beams can be fixed by the respective aperture section. The aperture element can in particular be of plate shape, with the plate size and/or the plate shape being able to correspond to a uniform plate size and/or plate shape of at least some of the components of the apparatus. The respective aperture section can be formed by an opening of the aperture element that is preferably circular and is coaxially aligned or offset with respect to a transmission axis or a reception axis of the optoelectronic transmitter or receiver. Optical properties of the optoelectronic apparatus can be fixed and unwanted interference influences (e.g. due to internal or outer reflections) can be suppressed by the arrangement and shape of the respective aperture section. The modularity of the described modular system is increased even more by different selectable aperture elements.

The aperture element can be arranged between the carrier device and the lens element. It is conceivable in this respect that the aperture element is captured in the vertical direction between the carrier device and the lens element, i.e. the aperture element is indirectly fastened to the apparatus such that no independent fastening of the aperture element is necessary and the components of the apparatus can be simply combined with different aperture elements. For this purpose, the aperture element can be formed at least sectionally (e.g. at the periphery) in a complementary manner to the holding device.

Alternatively or additionally to the aperture element, the optoelectronic apparatus can have further components such as a filter element for a spectral filtering of emitted or received radiation.

The holding device can in particular be in one part, with the holding device being able to be open at one side, in particular at the upper side of the apparatus, and being able to be closed there e.g. by the lens element or by the aperture element.

In accordance with a further embodiment, the holding device is formed in two parts, with the holding device having a lower part and an upper part. The lower part and the upper part can in this respect in particular be releasably secured to one another, with the lower part and/or the upper part being able to engage around or engage behind the carrier device as well as, optionally, the aperture element, and further optional components of the apparatus. The lower part of the holding device can have a bottom section and a plurality of connection sections protruding upwardly therefrom. The upper part of the holding device can furthermore have a top section and a plurality of connection sections projecting downwardly therefrom that cooperate with the connection sections of the lower part. The lower part and/or the upper part can have a substantially U-shaped cross-section to form a receiving space for at least the carrier device and the lens element, said receiving space simplifying the manufacture of the apparatus.

The carrier device and the lens element can be arranged between the lower part and the upper part of the holding device and can in particular be captured between the lower part and the upper part of the holding device in the vertical direction. The apparatus can thus be assembled particularly efficiently since the carrier device, the lens element and optional components do not have to be separately fastened. The carrier device and the lens element can, for example, be placed into the lower part, with the lower part then being closed by the upper part and with the lens element hereby being automatically fixed at the carrier device.

The lower part and the upper part of the holding device can in particular be fastened to one another by a latching connection.

The upper part of the holding device can have at least one aperture section for the at least one optoelectronic sensor and/or for the at least one optoelectronic receiver. The at least one aperture section of the upper part of the holding device can be provided in addition to or alternatively to the named aperture element. Additional variation and adaptation possibilities hereby result to be able to manufacture a desired apparatus type in a manner that is as simple as possible and efficiently, with nevertheless an optimum setting of the optical properties being able to be achieved.

The invention further relates to a system having a plurality of different optoelectronic apparatus in accordance with any one of the above-described embodiments, with the mechanical coding sections of the lens elements of at least some of the different optoelectronic apparatus being formed differently from one another. The coding section can in particular differ with respect to a coding element or a plurality of coding elements. The different apparatus can thus be distinguished from one another reliably and in a simple manner despite a modular design with similar elements, with each apparatus being able to be unambiguously identified due to the coding section.

At least one component of the different optoelectronic apparatus is preferably identically formed within such a system, in particular the holding device and/or the carrier device (apart from the optoelectronic or electronic elements provided thereat such as a transmitter, receiver and ASIC).

BRIEF DESCRIPTION OF THE DRAWING(S)

The invention will be described in the following purely by way of example with reference to the drawings, in which.

Figure 1:
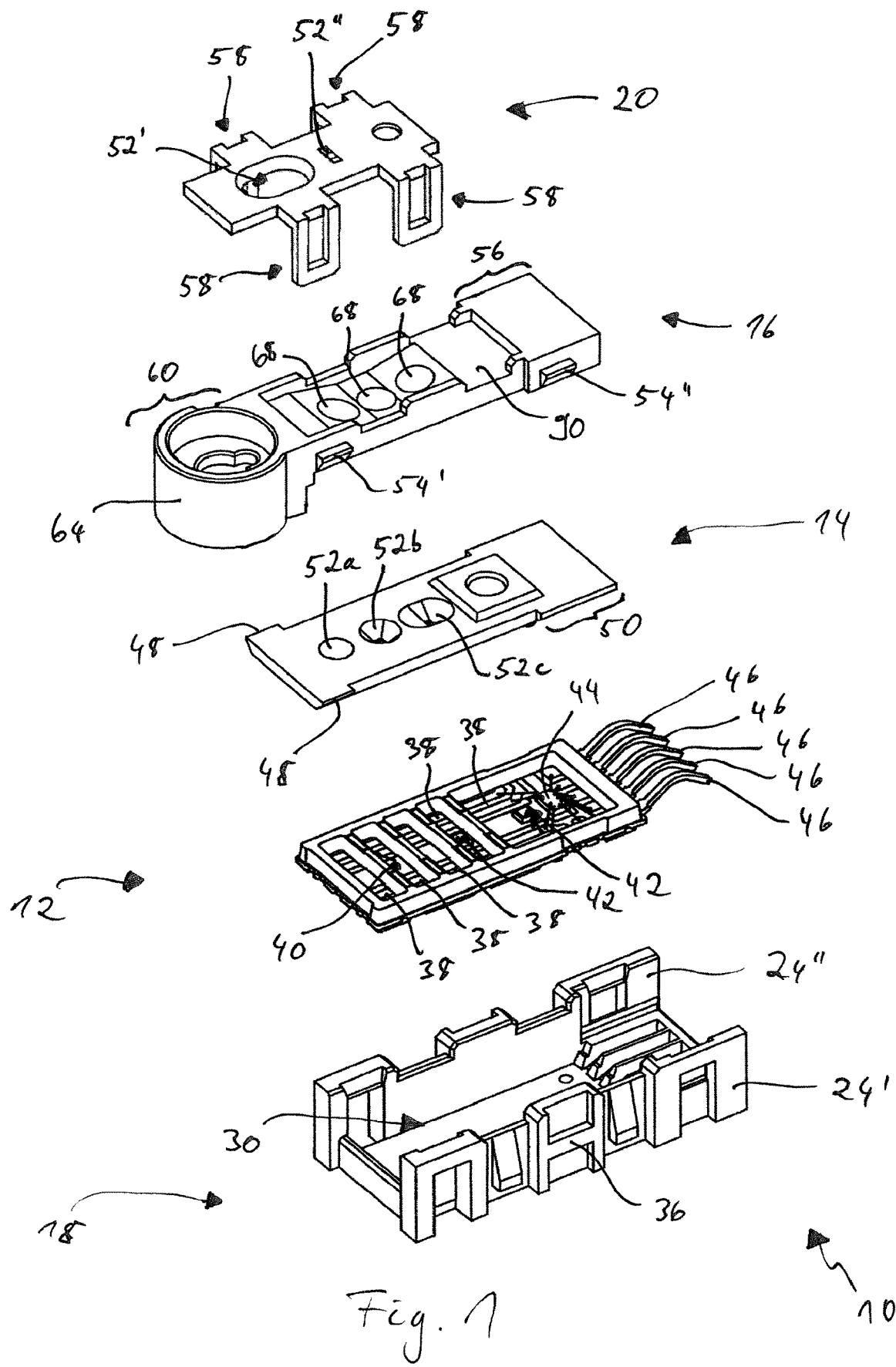
FIG. 1 is an exploded representation of a first embodiment of an optoelectronic apparatus.
Figure 5:
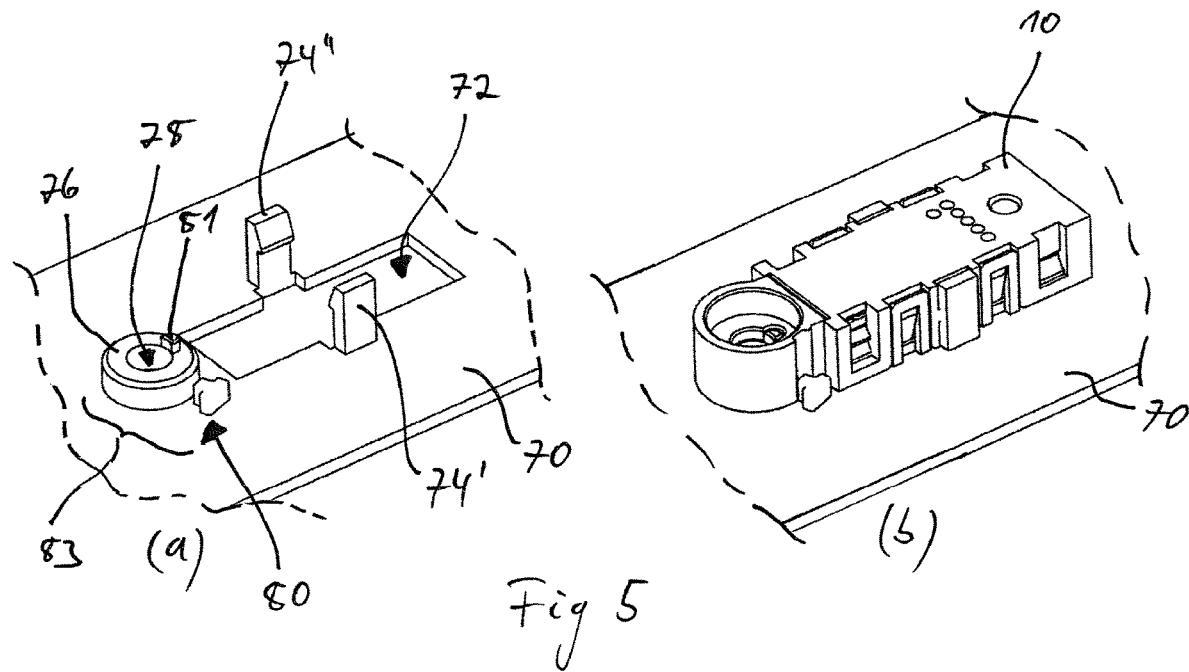
Figure 6:
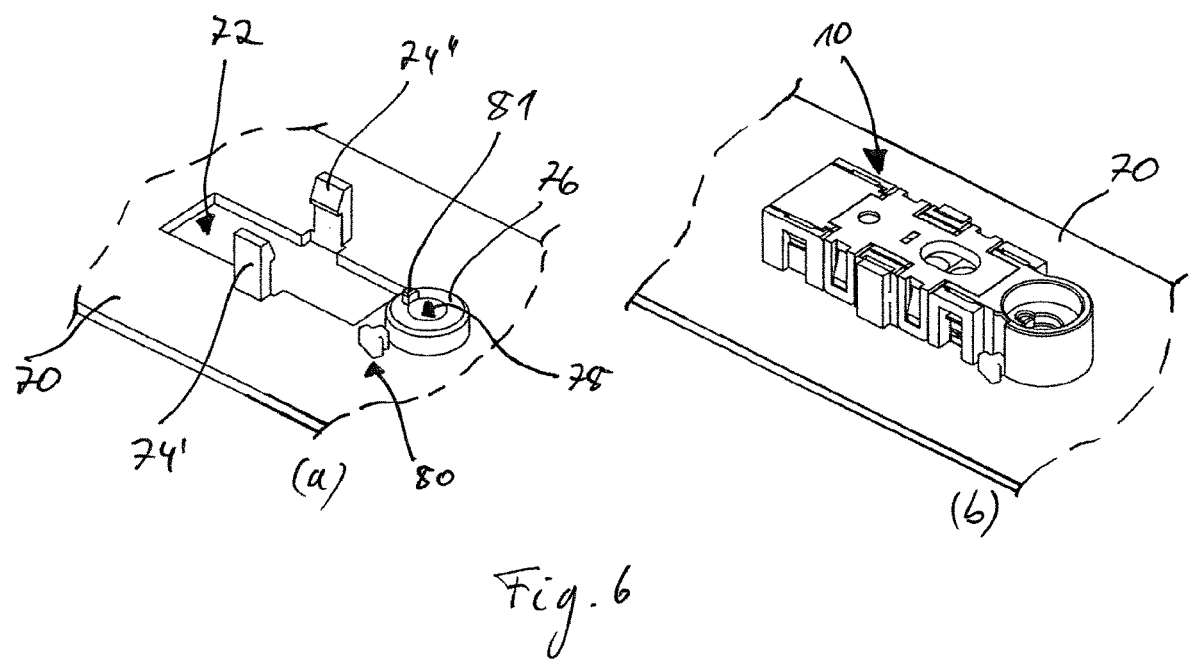

FIG. 5 comprises two perspective views of an installation site for an apparatus in accordance with FIG. 1, (a) without an installed apparatus and (b) with an assembled apparatus;

FIG. 6 comprises two perspective views of a further installation site for an apparatus in accordance with FIG. 1, (a) without an installed apparatus and (b) with an assembled apparatus; and FIG. 7 (*a*) is a perspective plan view from above, FIG. 7 (*b*) is a side view and FIG. 7 (*c*) is a rear view of a second embodiment of an optoelectronic apparatus.

The same or similar elements in the drawings are marked by the same reference numerals.

DETAILED DESCRIPTION OF THE PREFERRED EMBODIMENT(S)

An optoelectronic apparatus 10 comprises a carrier device 12, an optional aperture element 14, a lens element 16 and a holding device comprising a lower part 18 and an upper part 20. All of these components are shown obliquely from above in FIG. 1, i.e. the perspective is directed obliquely to a respective upper side of the components.

It will be described in the following how the apparatus 10 is assembled, with the individual components of the optoelectronic apparatus 10 being explained in more detail.

Figure 2:
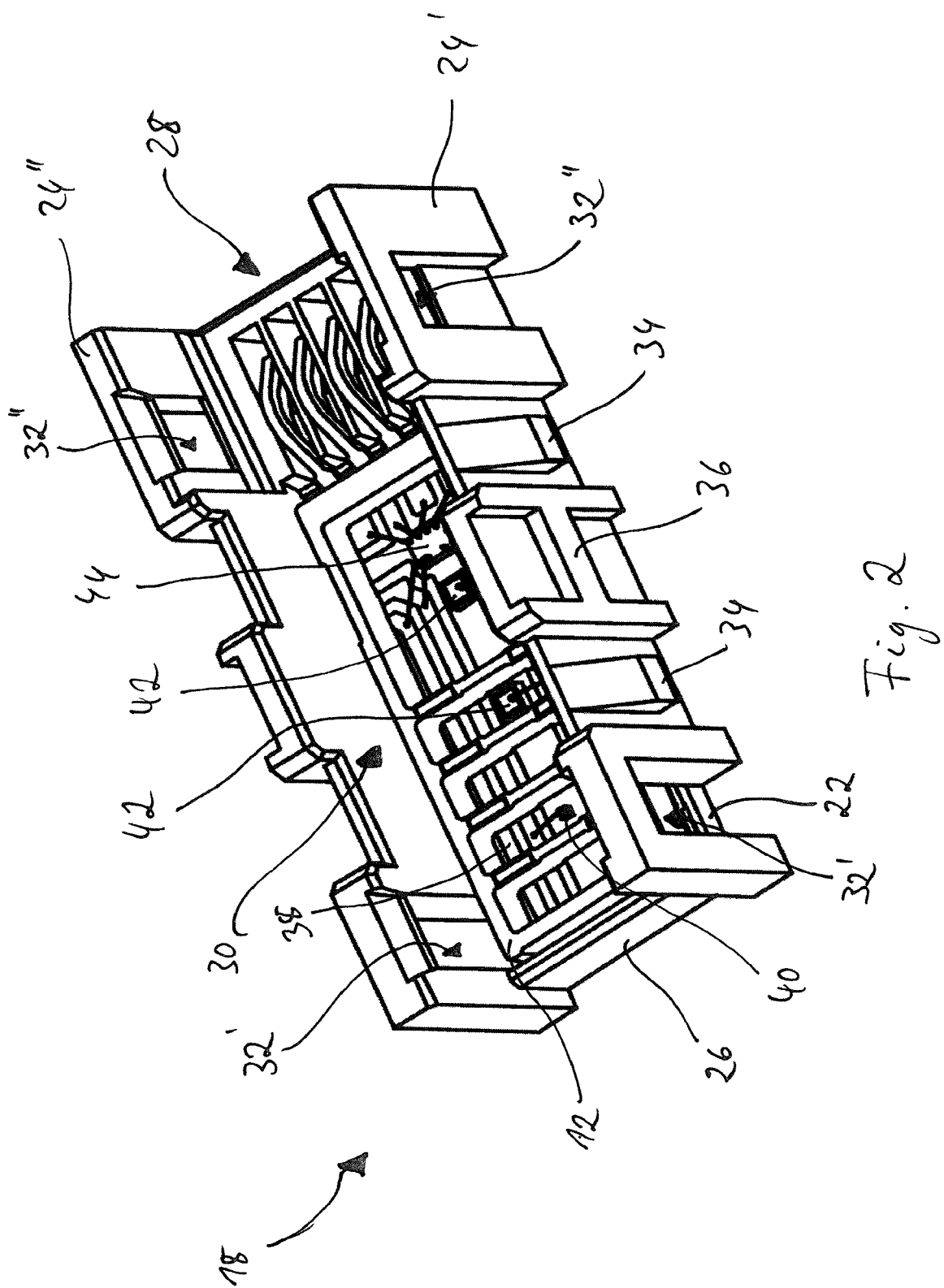
FIG. 2 is a perspective view of components of the apparatus of FIG. 1.

The carrier device 12 is first placed into the lower part 18. The lower part 18 with the inserted carrier device 12 is shown in FIG. 2, with the scale in FIG. 2 being enlarged with respect to FIG. 1. The lower part 18 has a bottom section 22 having a plurality of connection sections protruding upwardly therefrom. In detail, two side parts 24', 24" that are specularly symmetrical with respect to the longitudinal extent of the lower part 18 extend upwardly away from the bottom section 22, with the side parts 24', 24" being aligned substantially perpendicular to the bottom section 22. The bottom section 22 furthermore has an end face bolt 26 as well as a meshing section 28. The lower part 18 formed in U shape in this manner has a receiving space 30 completely upwardly open and partly laterally open for receiving the carrier device 12, the aperture element 14, and the lens element 16. The size and shape of the receiving space 30 sectionally substantially correspond to the size and shape of the carrier device 12, of the aperture element 14 and of the lens element 16. The components 12, 14 and 16 can thus be placed into the lower part 18 with an exact fit.

The side parts 24', 24" each have two rectangular openings 32' and 32" as well as two mutually spaced apart latching noses 34 at the outer side. The side parts 24', 24" furthermore each have a centrally arranged latching bolt 36 at the outside. The receiving space 30 is widened with respect to the central region in the region of the meshing section 28.

The carrier device 12 is formed as an overmolded lead frame (a so-called "premolded lead frame") that can be variably equipped. The periphery of the carrier device 12 is complementary to the receiving space 30 of the lower part 18 such that the carrier device 12 can be placed into the lower part 18 as shown in FIG. 2, with the carrier device 12 being laterally captured in the plane of the bottom section 22 between the bolt 26, the meshing section 28 and the side parts 24', 24". The upper side of the carrier device 12 is divided into a plurality of chambers 38 in the longitudinal direction, with an optoelectronic transmitter or an optoelectronic receiver generally being able to be attached and electrically contacted in each chamber 38. The carrier device 12 shown in FIG. 1 has an optoelectronic transmitter 40, two optoelectronic receivers 42 and an ASIC 44 (application-specific integrated circuit). To connect the carrier device 12 to an external microcontroller (not shown), a plurality of electrical connectors 46 are provided that extend away from the carrier device 12 in a uniform arcuate shape at a narrow side of the carrier device 12. When the carrier device 12 is placed into the lower part 18, the connectors 46 resiliently engage into the meshing section 28 of the lower part 18, whereby a contacting zone is formed for the introduction of an electrical plug-in connector (not shown) (FIG. 2).

Once the carrier device 12 has been placed into the lower part 18, the aperture element 14 is placed into the receiving space 30 of the lower part 18 (not shown). In this respect, a respective lateral projection 48 of the aperture element 14 engages into a respective opening 32', 32" of the side parts 24', 24" (FIG. 1 and FIG. 2). Furthermore, a broadened region 50 of the aperture element 14 engages into the receiving space 30 broadened in the region of the meshing section 28. In this manner, the aperture element 14 is in particular not displaceable in the longitudinal direction of the apparatus 10 and is secured to the lower part 18 in this respect. The aperture element 14 in FIG. 1 furthermore has three differently formed aperture sections 52*a*, 52*b* and 52*c* that are arranged behind one another in the longitudinal direction at the aperture element 14 and are formed by openings bordered in a substantially frustoconical shape.

Next, the lens element 16 is placed into the receiving space 30 of the lower part 18, with a respective lateral projection 54', 54" engaging into a respective opening 32', 32" of the side parts 24', 24". Furthermore, a broadened region 56 of the lens element 16 engages into the region of the receiving space 30 broadened in the region of the meshing section 28. The lens element 16 is in this manner fixed to the lower part 18 in the longitudinal and transverse direction in a plane in parallel with the bottom section 22.

Finally, the upper part 20 of the holding device is fastened by means of a latching connection to the lower part 18, with the upper part 20 for this purpose having four downwardly protruding latching tabs 58 that each latch with one of the latching noses 34 of the side parts 24', 24". The carrier device 12, the aperture element 14 and the lens element 16 are now completely captured and fixed to one another between the upper part 20 and the lower part 18. The lower part 18 of the holding device, the carrier element 12, the aperture element 14, the lens element 16 and the upper part 20 of the holding device are thus arranged behind one another along a vertical direction.

Figure 3:
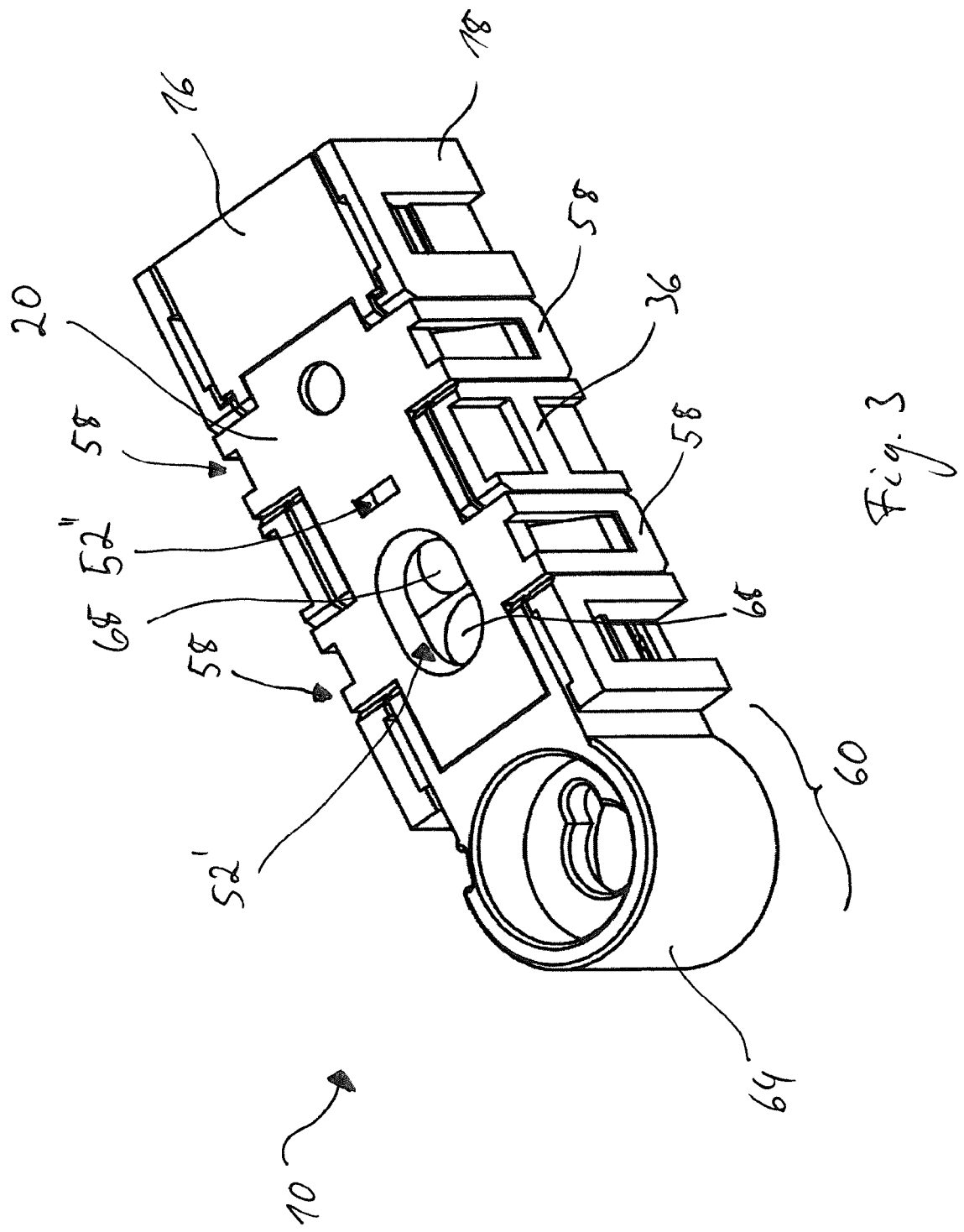
FIG. 3 is a perspective view of the apparatus of FIG. 1 in an assembled state.

The apparatus 10 assembled in this manner is shown in perspective in FIG. 3. The upper part 20 has two aperture sections 52', 52" and thus simultaneously serves as a further aperture element (cf. FIG. 1 and FIG. 3). It can furthermore be recognized that the upper part 20 engages into a complementary engagement section 90 of the lens element 16 (cf. FIG. 1) such that the upper part 20 ends flush with the lens element 16 and a substantially smooth upper side of the apparatus 10 is formed. The lens element 16 is furthermore additionally fixed and the size of the apparatus 10 is kept small.

The optical properties of the optoelectronic apparatus 10 are fixed by the three aperture sections 52a, 52b and 52c of the aperture element 14 in combination with the two aperture sections 52', 52" of the upper restriction 20 and unwanted interference influences are suppressed in that a geometrical boundary of the respective cross-section of the emitted or received beams takes place.

The apparatus 10 has a slim, substantially parallelepiped base body, with the outer skin of the apparatus being characterized by surfaces that substantially end flush with one another. The latching tabs 58 in particular end flush with the outer side of the side parts 24', 24".

The substantially plate-shaped lens element 16 has an integrally formed mechanical coding section 60 that extends away from the otherwise plate-shaped lens element 16 in the longitudinal direction (FIG. 1). The ring-shaped coding section 60 has a hollow cylinder 64 that protrudes perpendicular from a plane of extent of three lens sections 68 of the lens element 16 arranged behind one another in the longitudinal direction. The lens sections 68 of the lens element 16 have beam-shaping properties and can, for example, comprise convex lenses, biconvex lenses or Fresnel lenses.

Figure 4:
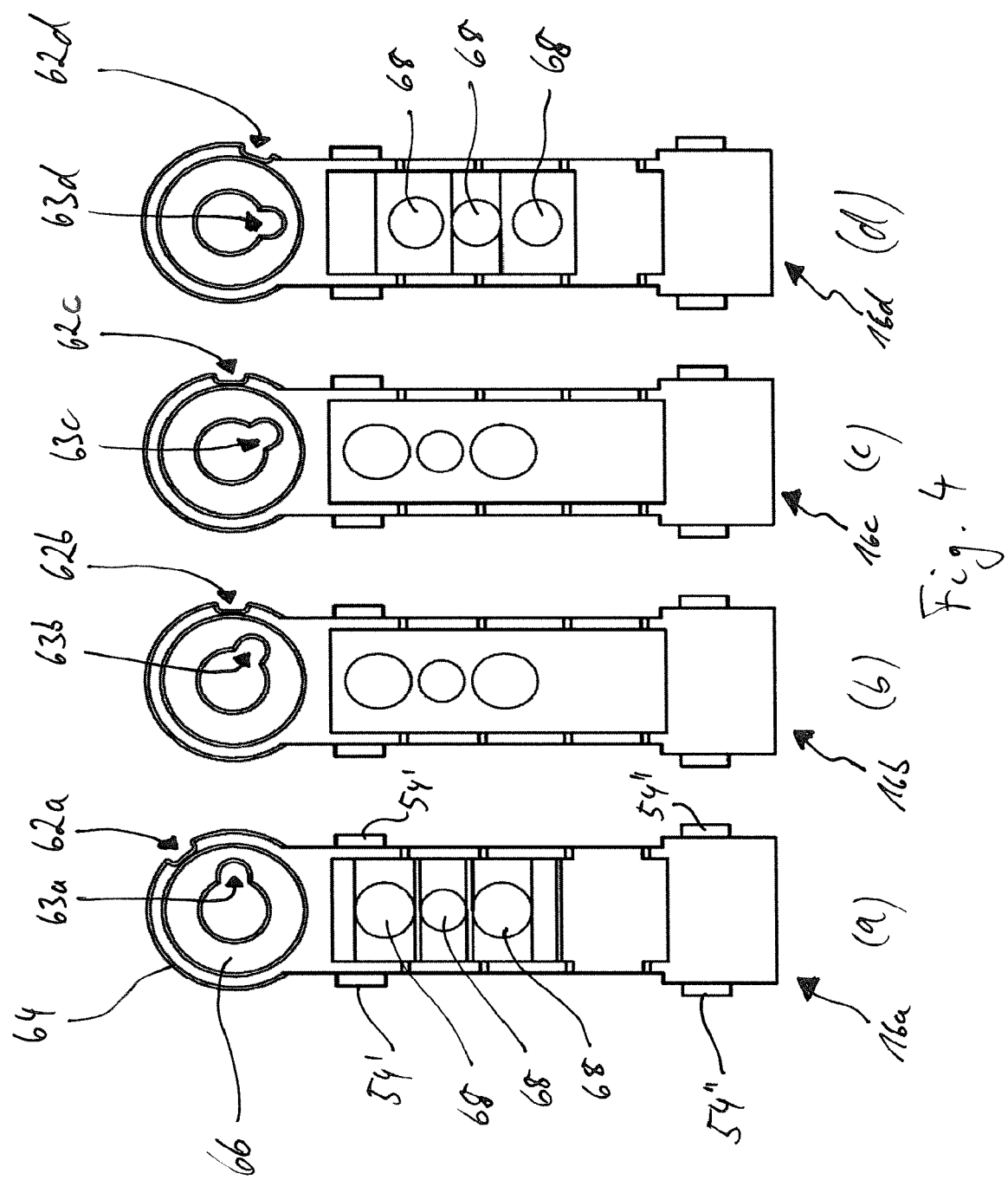
FIG. 4 is a plan view from above of four embodiments of a lens element for the apparatus of FIG. 1.

Further details with respect to the lens element 16 are shown in FIGS. 4 (a) to (d) in which four different variants of the lens element 16 are shown in a respective plan view of the respective upper side of the lens element 16. The lens elements 16a, 16b, 16c, 16d shown in FIGS. 4 (a) to (d) have a respective first coding element 62a to 62d and a respective second coding element 63a to 63d at the coding section 60. The respective first coding element 62 is formed as a rectangular recess at the outer periphery of the hollow cylinder 64 of the coding element 60, with the coding elements 62a to 62d only differing with respect to the angular position about the axis of the hollow cylinder 64. The respective first coding element 62 extends in parallel with the cylinder axis (perpendicular to the plane of the paper in FIG. 4) such that a rectangular groove is produced in the cylinder jacket of the hollow cylinder 64. A ring disk 66 extends within the hollow cylinder 64 perpendicular to its longitudinal axis. The respective second coding element 63 is provided at the inner periphery of the ring disk 66; it is configured as a substantially semicircular recess and extends at different angular positions about the axis of the hollow cylinder 64 in parallel with the cylinder axis as a round groove.

The first coding elements 62 are only provided by way of example for the purpose of identifying the underlying apparatus 10 with respect to an apparatus type. An apparatus type is in particular characterized by the respective configuration of the lens element 16 and by the equipping of the carrier device 12 with optoelectronic transmitters 40 or receivers 42. In this respect, the position and the configuration of lens sections 68 of the lens elements 16 can be different, as is shown by way of example in FIGS. 4 (a)-(d) with reference to the lens elements 16a to 16d. The second coding elements 63 are provided to identify the apparatus 10 with respect to a bus that is provided for connecting the carrier device 12 to a microcontroller.

This list is only by way of example. In principle, the coding element 62, 63 can identify the optoelectronic apparatus 10 with respect to freely definable features. The coding elements 62, 63 are only defined, in addition to their shape, in dependence on their angular position about the longitudinal cylinder 64. The coding elements 62, 63 can thus be produced simply with the aid of an adjustable tool, with the angular position of the respective coding element 62, 63 enabling an unambiguous identification of the apparatus 10 with respect to the feature associated with the respective coding element 62, 63.

Two perspective views of an installation site for an optoelectronic apparatus 10 are shown in FIG. 5 that is also called an installation environment of the optoelectronic apparatus 10 in connection with the invention. In FIG. 5(a), the installation site is shown as such, i.e. without a respective apparatus 10 being installed. The installation site is characterized by a section of a base plate 70 having a rectangular opening 72 at whose inner longitudinal edges two mutually oppositely disposed latching arms 74', 74" are provided. Adjacent to a narrow side of the opening 72, a cylinder 76 is formed that extends perpendicular to the plane of the base plate 70 and that is provided with a central opening 78. The opening 78 can have an internal thread for a screw, not shown.

The cylinder 76 has a first decoding element 80 and a second decoding element 81. The first decoding element 80 is of T shape and is spaced apart from the jacket surface of the cylinder 76 in the radial direction. The height of the decoding element 80 is less than the height of the cylinder 76. The second decoding element 81 is formed at the end face of the cylinder 76 and has a cylindrical shape sectionally. The cylinder 76 and the decoding elements 80 and 81 together form a decoding section 83 for the coding section 60 of an apparatus. The decoding section 83 is formed in one part with the base plate 70. The edges of the cylinder 76 and of the decoding elements 80 and 81 have a respective chamfer that facilitates the installation of the apparatus 10.

The apparatus 10 to be installed at the installation site shown in FIG. 5 (a) is installed with the upper side of the apparatus 10 at the front such that the apparatus 10 adopts the position shown in FIG. 5 (b) in which the upper side of the apparatus 10 faces the opening 72 of the base plate 70. It is ensured by the decoding section 83 that only that apparatus 10 can be installed that has a coding section 60 which is formed complementary to the decoding section 83 and which unambiguously defines the installation of the apparatus 10 at the respective installation site by shape matching. In the assembled state, the first coding element 62 engages into the first decoding element 80. The second coding element 63 furthermore engages sectionally into the second decoding element 81. The latching arms 74', 74" are furthermore latched to the latching bolts 36 of the lower part 18 such that the apparatus 10 is securely fastened to the base plate 70.

A further installation site for an apparatus 10 is shown in FIG. 6, with the apparatus 10 being installed in reverse in FIG. 6 (b), unlike the case of FIG. 5 (b), i.e. the beam-emitting or beam-receiving upper side of the apparatus 10 is remote from the base plate 70. The apparatus 10 can thus be installed flexibly in different manners at an installation site formed substantially the same, with only the position of the coding elements 62, 63 and the positions of the decoding elements 80, 81 having to be coordinated with one another for this purpose (cf. FIG. 5 (a) and FIG. 6 (a)).

The base shape of the coding section 60 (in particular the hollow cylinder 64 with the ring disk 66) is preferably formed symmetrically with respect to a center plane of the optoelectronic apparatus 10 that is perpendicular to the vertical direction. It is furthermore preferred if a fastening device for fastening the optoelectronic apparatus 10 to an installation environment (in particular the latching bolts 36 of the holding device for the latching arms 74', 74" of the base plate 70) is formed symmetrically with respect to a center plane of the optoelectronic apparatus 10 that is perpendicular to the vertical direction. The apparatus 10 can hereby selectively be particularly simply fastened in one of two different alignments of its upper side at the installation environment, as has been explained with reference to FIGS. 5 and 6.

A further embodiment of the optoelectronic apparatus 10 is shown in FIG. 7 that in particular differs from the embodiment shown in FIGS. 1-3 in that the apparatus 10 has a single-part holding device 82. In the assembled state of the apparatus 10, the lens element 16 in this respect forms the upper side of the apparatus 10 and is latched to the holding device 82. Optionally, an aperture element 14 can be arranged between the lens element 16 and the carrier device 12, in particular captured in the vertical direction. The apparatus 10 is shown in a plan view from above in FIG. 7 (a). FIG. 7 (b) shows the apparatus 10 in a side view in which it can be recognized that the thickness 84 of the apparatus 10 in the region of the holding device 82 is larger than the thickness 86 of the coding section 60. Mechanical strains between the lens element 16 and the holding device 82 can hereby be avoided. The apparatus 10 is shown in a rear view in FIG. 7 (c). As in particular results from FIG. 7 (a) and FIG. 7 (c), the coding section 60 only projects out of the holding device 82 in the longitudinal direction, with the coding section 60 not extending over the width 88 of the apparatus 10. The slim and rectangular shape of the apparatus 10 is thus not impaired by the coding section 60.

It must still be noted with respect to the explained embodiments that the carrier device 12 can be variably equipped, in particular with different numbers of optoelectronic transmitters 40 and/or optoelectronic receivers 42. A simple adaptation to different applications is possible by the modular construction of the respective optoelectronic apparatus 10, with in particular also a number of aperture sections 52 and lens sections 68 corresponding to the number of transmitters 40 and receivers 43 being able to be provided by replacing individual components (aperture element 14 or lens element 16).

REFERENCE NUMERAL LIST 10 optoelectronic apparatus
12 carrier device
14 aperture element
16 lens element
18 lower part
20 upper part
22 bottom section
24 side part
26 bolt
28 meshing section
30 receiving space
32 opening
34 latching noses
36 latching bolt
38 chamber
40 transmitter
42 receiver
44 ASIC
46 connector
48 projection
50 region
52 aperture section
54 projection
56 region
58 latching tabs
60 coding section
62 first coding element
63 second coding element
64 hollow cylinder
66 ring disk
68 lens section
70 base plate
72 opening
74 latching arm
76 cylinder
78 opening
80 first decoding element
81 second decoding element
82 holding device
83 decoding section
84 thickness of the apparatus
86 thickness of the coding section
88 width of the apparatus
90 engagement section

The invention claimed is:

1. An optoelectronic apparatus, comprising:
a carrier device that has at least one of: at least one optoelectronic transmitter and at least one optoelectronic receiver at an upper side;
a lens element that is provided above the carrier device with respect to a vertical direction and that has at least one lens section for at least one of: the at least one optoelectronic transmitter and the at least one optoelectronic receiver; and
a holding device that holds the carrier device and the lens element relative to one another and partly surrounds the carrier device and the lens element, and the at least one lens section of the lens element is substantially surrounded by the holding device,
wherein the lens element has a mechanical coding section that projects out of the holding device in a lateral direction which is transverse to the vertical direction, and that has at least one coding element for identifying the optoelectronic apparatus.

2. The optoelectronic apparatus in accordance with claim 1, wherein:
the optoelectronic apparatus has a shape that is at least substantially rectangular in cross-section, and
the mechanical coding section projects out of the holding device at a narrow side of the rectangular shape.

3. The optoelectronic apparatus in accordance with claim 1, wherein the at least one coding element comprises at least one of: at least one elevated portion and at least one recess of the mechanical coding section.

4. The optoelectronic apparatus in accordance with claim 1, wherein a piece of identification information of the at least one coding element is detectable along the vertical direction.

5. The optoelectronic apparatus in accordance with claim 1, wherein the mechanical coding section has a ring-shaped structure.

6. The optoelectronic apparatus in accordance with claim 5, wherein the at least one coding element is provided at least one of: an outer periphery, an inner periphery, and an end face of the ring-shaped structure.

7. The optoelectronic apparatus in accordance with claim 5, wherein:
the mechanical coding section has a first coding element and a second coding element,
the first coding element is provided at an outer periphery of the ring-shaped structure, and
the second coding element is provided at an inner periphery of the ring-shaped structure.

8. The optoelectronic apparatus in accordance with claim 5, wherein the ring-shaped structure comprises a hollow cylinder.

9. The optoelectronic apparatus in accordance with claim 8, wherein a ring-disk extends within the hollow cylinder in a plane perpendicular to the longitudinal axis of the hollow cylinder.

10. The optoelectronic apparatus in accordance with claim 1, wherein:
the at least one lens section of the lens element extends within a plane of extent of the lens, and
the mechanical coding section projects out of the plane of extent of the lens.

11. The optoelectronic apparatus in accordance with claim 1, wherein the holding device and the lens element are directly or indirectly secured to one another by means of a latching connection.

12. The optoelectronic apparatus in accordance with claim 1, wherein the lens element is captured between the holding device and the carrier device.

13. The optoelectronic apparatus in accordance with claim 1, wherein the optoelectronic apparatus further has an aperture element that has at least one aperture section for at least one of: the at least one optoelectronic transmitter and the at least one optoelectronic receiver.

14. The optoelectronic apparatus in accordance with claim 13, wherein the aperture element is arranged between the carrier device and the lens element.

15. The optoelectronic apparatus in accordance with claim 1, wherein:
the holding device is formed in two parts, and
wherein the holding device has a lower part and an upper part.

16. The optoelectronic apparatus in accordance with claim 15, wherein the carrier device and the lens element are arranged between the lower part and the upper part of the holding device.

17. The optoelectronic apparatus in accordance with claim 15, wherein the lower part and the upper part of the holding device are fastened to one another by means of a latching connection.

18. The optoelectronic apparatus in accordance with claim 15, wherein the upper part of the holding device has at least one aperture section for at least one of: the at least one optoelectronic transmitter and the at least one optoelectronic receiver.

19. The optoelectronic apparatus in accordance with claim 1, wherein the holding device is formed in one part and has an open upper side, with the lens element being arranged at the upper side of the holding device.

20. A system comprising:
a plurality of optoelectronic apparatus, each of the plurality of optoelectronic apparatus comprising:
a carrier device that has at least one of: at least one optoelectronic transmitter and at least one optoelectronic receiver at an upper side,
a lens element that is provided above the carrier device with respect to a vertical direction and that has at least one lens section for at least one of: the at least one optoelectronic transmitter and the at least one optoelectronic receiver, and
a holding device that holds the carrier device and the lens element relative to one another and partly surrounds the carrier device and the lens element,
wherein the lens element has a mechanical coding section that projects out of the holding device and that has at least one coding element for identifying the optoelectronic apparatus,
wherein the mechanical coding sections of the lens elements of at least some of the different optoelectronic apparatus are formed differently from one another.

21. The system of claim 20, wherein the at least one coding element comprises at least one of at least one elevated portion and at least one recess of the mechanical coding section formed with respect to a rotationally symmetrical structure, the mechanical coding section having a ring-shaped structure, wherein the at least one coding element is provided at at least one of: an outer periphery, an inner periphery and an end face of the ring-shaped structure.

22. The system of claim 20, wherein the coding elements of at least some of the different optoelectronic apparatus differ from one another in at least one of: their shape, their size and their position.

23. The system of claim 20, wherein the mechanical coding section and the at least one lens section are integrally formed with the lens element.

24. An optoelectronic apparatus comprising:
a carrier device that has at least one of at least one optoelectronic transmitter and at least one optoelectronic receiver at an upper side;
a lens element that is provided above the carrier device with respect to a vertical direction and that has at least one lens section for the at least one of the at least one optoelectronic transmitter and the at least one optoelectronic receiver; and
a holding device that holds the carrier device and the lens element relative to one another and partly surrounds the carrier device and the lens element,
wherein the lens element has a mechanical coding section that projects out of the holding device in a lateral direction which is transverse to the vertical direction, and that has at least one coding element for identifying the optoelectronic apparatus,
wherein the at least one coding element comprises at least one of at least one elevated portion and at least one recess of the mechanical coding section formed with respect to a rotationally symmetrical structure, the mechanical coding section having a ring-shaped structure,
wherein the at least one coding element comprises a first coding element and a second coding element, the first coding element being provided at an outer periphery and the second coding element being provided at an inner periphery of the ring-shaped structure.

* * * * *